United States Patent [19]
Suzuki et al.

[11] 3,968,450
[45] July 6, 1976

[54] TRANSISTOR AMPLIFIER

[75] Inventors: Tadao Suzuki, Tokyo; Kazuhiko Kamimura, Yokohama, both of Japan

[73] Assignee: Sony Corporation, Tokyo, Japan

[22] Filed: Mar. 20, 1975

[21] Appl. No.: 560,512

[30] Foreign Application Priority Data
Mar. 29, 1974   Japan.............................. 49-35282
Apr. 25, 1974   Japan.............................. 49-46939

[52] U.S. Cl. ................................ 330/15; 330/13; 330/24; 330/35
[51] Int. Cl.² ....................... H03F 3/16; H03F 3/26
[58] Field of Search ................ 330/13, 15, 24, 35

[56] References Cited
UNITED STATES PATENTS
3,300,585   1/1967   Reedyk et al. .................. 330/35 X
3,469,203   9/1969   Poitras ............................ 330/15 X Primary Examiner—James B. Mullins
Attorney, Agent, or Firm—Lewis H. Eslinger; Alvin Sinderbrand

[57] ABSTRACT

A transistor amplifier comprised of a field effect transistor having triode-type dynamic characteristics in combination with a bipolar transistor. The current flowing through the field effect transistor is a function of an input signal. The bipolar transistor is substantially nonconductive until the field effect transistor current reaches a threshold level and then current flows through the bipolar transistor as a function of the input signal. The currents produced by the field effect and bipolar transistors are supplied to a load.

24 Claims, 11 Drawing Figures

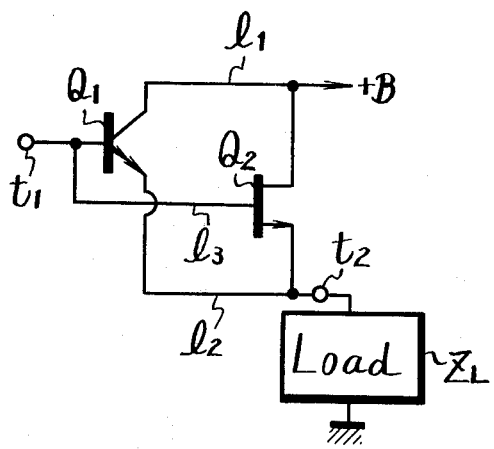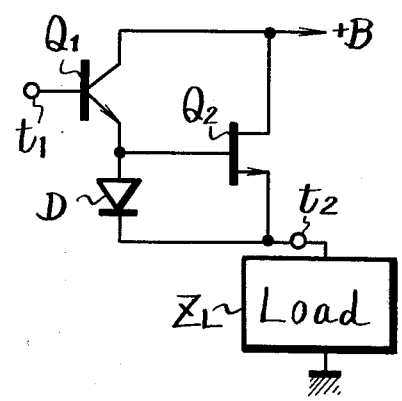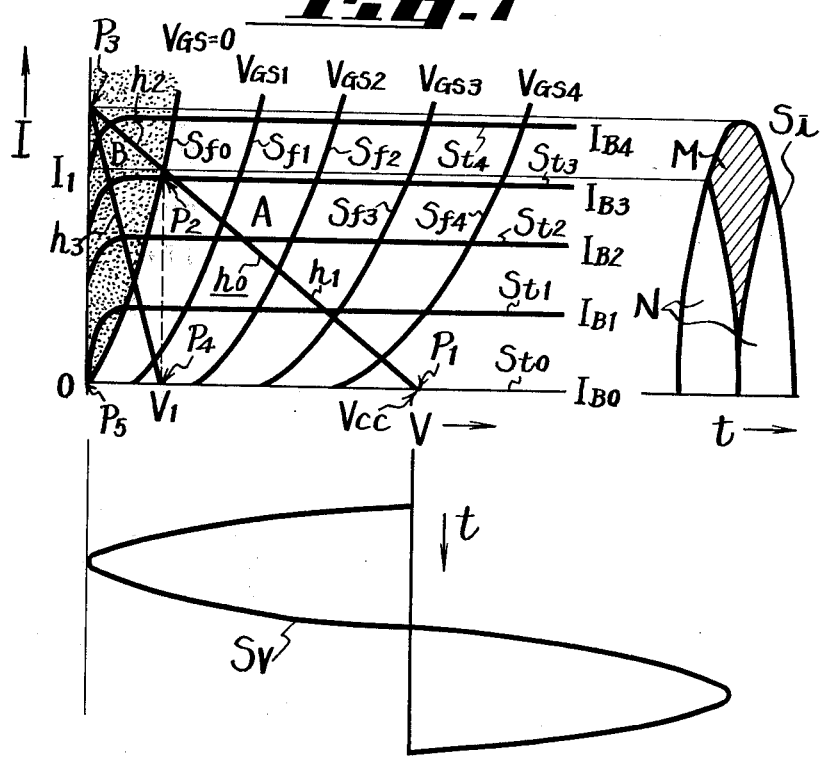

TRANSISTOR AMPLIFIER

BACKGROUND OF THE INVENTION

This invention relates to transistor amplifiers and, in particular, to an improved transistor amplifier which efficiently utilizes an operating voltage, amplifies a large input signal with satisfactory fidelity and has minimal output impedance so as to reduce operating losses.

Conventional field effect transistors of the type used in the prior art are characterized by their pentode-type dynamic characteristics. These prior art field effect transistors (FET's) are not well-suited for amplifying circuits wherein minimal cross-over distortion is required. Accordingly, an improved FET has been proposed which is formed of vertical-type junctions so that it exhibits triode-type dynamic characteristics. This improved FET has a relatively low output impedance, on the order of about 10 ohms, as well as low signal distortion so that it finds ready application in the output stages of audio power amplifiers. Furthermore, this improved FET having triode-type dynamic characteristics exhibits superior switching qualities over the prior art FET so that it can be advantageously used in a single ended push-pull (SEPP) amplifier without accompanying undesired cross-over distortion.

Unfortunately, when the gate-source voltage of the improved FET is reduced to zero, the resultant saturation condition prevents proper amplification of a large input signal. Consequently, because of this saturation characteristic of the improved FET, its response to a large input signal is even less desirable than that of a conventional bipolar transistor.

Now, if bipolar transistors are used to amplify large input signals, for example, when used in a push-pull amplifier, cross-over distortion normally is present. This distortion is most undesirable. Also, when a bipolar transistor is conducting, its resistance, for example, the collector-emitter resistance (also known as the OH resistance) is relatively high. This high resistance of the conducting bipolar transistor results in an inefficient use of the operating voltage which is applied thereto. Stated otherwise, the bipolar transistor exhibits a low source voltage utilization rate. Therefore, when a large output is required, the attendant cross-over distortion and inefficient use of the operating voltage often determines that a plurality of FET's are to be used in an attempt to avoid the aforenoted poor saturation characteristics of an individual FET. Unfortunately, the use of plural ones of these devices to avoid such poor saturation characteristics is extremely expensive.

OBJECTIVES OF THE INVENTION

Therefore, it is an object of the present invention to provide an improved transistor amplifier capable of amplifying a large input signal with fidelity, having relatively low output impedance, having minimal cross-over distortion and efficiently utilizing the operating voltage applied thereto.

Another object of this invention is to provide an improved transistor amplifier formed of an FET having triodetype dynamic characteristics connected for operation with a bipolar transistor, the bipolar transistor being adapted to operate when the FET is driven to its saturation region.

A further object of this invention is to provide an improved transistor amplifier having superior switching characteristics so as to be advantageously used in push-pull configuration.

A still further object of this invention is to provide an improved transistor amplifier having high breakdown voltage characteristics.

A still further object of this invention is to provide an improved transistor amplifier formed of an FET having triode-type dynamic characteristics and a novel bipolar transistor which is operated at a low collector-emitter voltage to thereby reduce its collector loss.

Yet another object of this invention is to provide an improved transistor amplifier having an enhanced source voltage utilization rate and which is formed of a field effect transistor having triode-type dynamic characteristics and a bipolar transistor, the latter transistor exhibiting a large opened-collector base-emitter breakdown voltage.

A further object of this invention is to provide a transistor amplifier which is readily adapted for push-pull amplification and which is formed of an FET having triode-type dynamic characteristics and a bipolar transistor, and wherein only the FET is conductive when the amplifier load current is less than a threshold level but both the FET and the bipolar transistor are conductive when the amplifier load current exceeds the threshold level.

A still further object of this invention is to provide an improved transistor amplifier formed of an FET having triode-type dynamic characteristics and a bipolar transistor, and wherein the bipolar transistor is rendered conductive once the FET is driven into its saturation condition.

Another object of this invention is to provide an improved transistor amplifier which is capable of amplifying small and large input signals with fidelity.

Another object of this invention is to provide an improved transistor amplifier which is readily adapted for use in a single ended push-pull amplifier.

Various other objects and advantages of the invention will become apparent from the forthcoming detailed description and the novel features will be particularly pointed out in the appended claims.

SUMMARY OF THE INVENTION

In accordance with this invention, a transistor amplifier is provided comprised of an FET having triode-type dynamic characteristics in combination with a bipolar transistor; the bipolar transistor being nonconductive until the current flowing through the FET reaches a predetermined threshold level; and the sum of the FET and bipolar transistor currents is supplied to a load.

In one embodiment, the transistor amplifier formed of the combination of the FET and the bipolar transistor is used as the output stages of a push-pull amplifier.

BRIEF DESCRIPTION OF THE DRAWINGS

The following detailed description will best be understood in conjunction with the accompanying drawings in which:

FIG. 6 is a schematic diagram showing one embodiment of the transistor amplifier in accordance with this invention;

FIG. 7 is a graphical representation of the dynamic characteristics exhibited by the transistor amplifier of this invention and which will be used in explaining the embodiment shown in FIG. 6;

FIG. 8 is a schematic diagram of another embodiment of the transistor amplifier in accordance with this invention.

DETAILED DESCRIPTION OF CERTAIN ONES OF THE PREFERRED EMBODIMENTS

A Preferred Embodiment of the FET

Figure 1:
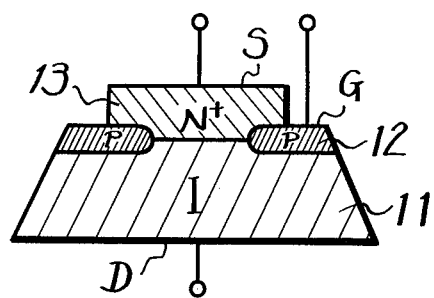
FIG. 1 is a sectional view showing one example of an FET having triode-type dynamic characteristics which may be used in the transistor amplifier of the present invention.

Turning now to the drawings and, in particular, to FIG. 1, there is depicted a sectional view of one example of an FET having triode-type dynamic characteristics which may be used in the transistor amplifier in accordance with this invention. The FET is a vertical junction structure formed of an intrinsic semiconductor region 11 having low impurity concentration and high resistance, a P-type semiconductor region 12 having an annular configuration and formed on the upper portion of the intrinsic region 11, and a N-type semiconductor region 13 having high impurity concentration formed over both the annular P-type region 12 and the intrinsic region 11, as shown. Respective drain (D), gate (G) and source (S) electrodes are provided at the lower surface of the intrinsic region 11, an exposed portion of the P-type annular region 12 and the upper surface of the N-type region 13, respectively.

Figure 2:
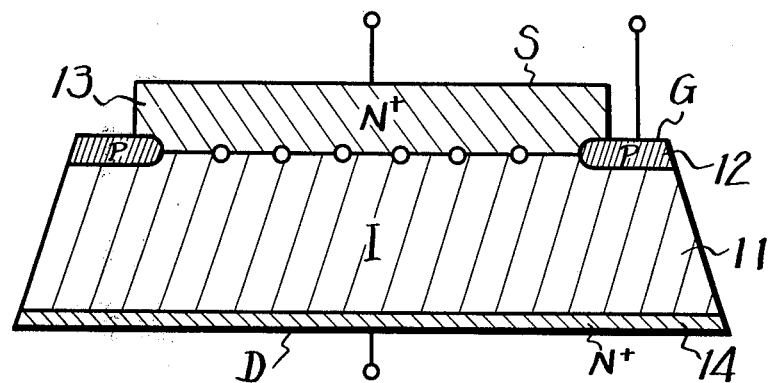
FIG. 2 is a sectional view showing another example of an FET having triode-type dynamic characteristics which may be used in the transistor amplifier of the present invention.

The vertical junction FET depicted in FIG. 1 exhibits triode-type dynamic characteristics. A preferred embodiment of such an FET is depicted in FIG. 2 wherein like reference numerals identify corresponding elements. As is apparent, the FIG. 2 embodiment closely resembles the aforedescribed FIG. 1 embodiment of the FET with the added modifications that the P-type annular region 12 is formed with a mesh-type structure therewithin, as shown. Accordingly, the high impurity concentration N-type region 13 is seen to overlie both the annular and mesh-shape P-type region 12 and the intrinsic region 11, the mesh-shape defining a boundary between the intrinsic region and the overlying high impurity concentration N-type region. Furthermore, an additional N-type semiconductor region 14 having high impurity concentration is formed on the lower surface of the intrinsic semiconductor region 11, and the drain electrode D is formed thereon.

The advantages of the vertical junction FET having triode-type dynamic characteristics, as depicted in FIG. 2, will best be understood by comparing the illustrated FET with prior art FET's which generally exhibit pentode-type dynamic characteristics. In general, the apparent conversion conductance gm of a junction FET may be expressed as:

$$gm = Gm/(1 + Rc \cdot Gm)$$

where Gm is the true conversion conductance and Rc is an equivalent internal resistance of the FET between the source and drain electrodes. The resistance Rc is a composite resistance comprised of the resistance between the source electrode and the channel within the FET, the resistance of the channel itself and the resistance between the channel and the drain electrode. In the prior art junction FET the source-to-channel resistance is high, the channel resistance is high because of its narrow and long configuration and the channel-to-drain resistance also is high. Consequently, it is appreciated that the resistance Rc in the prior art junction FET is very high. As a result of this high resistance, and as will be seen from the above equation, the apparent conversion conductance gm is essentially equal to the reciprocal of the resistance Rc. Because of this feature, the prior art junction FET exhibits pentode-type dynamic characteristics and, as is apparent therefrom, the drain current becomes saturated as the drain voltage is increased.

In comparison to the aforedescribed prior art junction FET, the FET shown in FIG. 2 is characterized by a relatively small separation between the source electrode S and a channel formed in the P-type region 12 and, additionally, the channel length itself is relatively small. Consequently, the resistance Rc of the vertical junction FET depicted in FIG. 2 is much smaller than the resistance Rc of the prior art FET and the true conversion conductance Gm is high. The product RcGm generally is less than unity. Thus, as is recognized from the above equation, the apparent conversion conductance gm of the vertical junction FET, shown by way of example in FIG. 2, which is used with the present invention, closely approximates the true conversion conductance Gm depending upon the width variation of the depletion layer.

Figure 3:
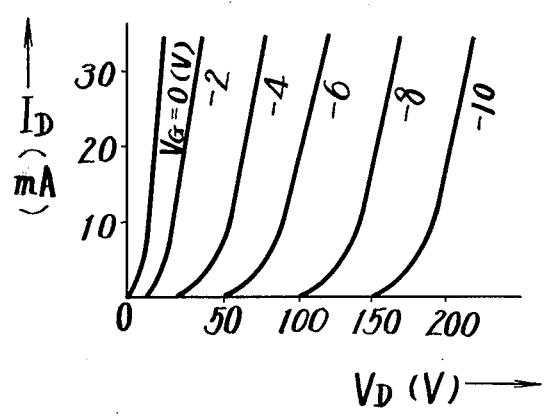
FIG. 3 is a graphical representation of the dynamic characteristics of the FET which may be used in the transistor amplifier of this invention.

An illustration of the dynamic characteristics exhibited by the FET shown in FIG. 2 is graphically represented in FIG. 3. This graphical representation depicts the relationship between the drain current $I_d$, in milliamps, and the drain voltage $V_d$ in volts. Each individual curve represents the current-voltage relationship for corresponding gate voltages $V_g$ wherein the gate voltage is the variable parameter. It is recognized that the characteristic curves shown in FIG. 2 are analogous to the curves which represent the dynamic characteristics of a conventional triode. Therefore, because the FET is of the type which exhibits triode-type dynamic characteristics, the resistance Rc is substantially constant, even in the environment of voltage variations, and the FET is capable of producing a large output signal having little distortion.

Preferred Embodiments of a Bipolar Transistor

One characteristic which generally is used to evaluate a bipolar transistor is the grounded emitter current amplification factor $h_{FE}$. In accordance with preferred embodiments of a bipolar transistor which can be used with the present invention, the amplification factor $h_{FE}$ is very high in comparison with that of the usual prior art bipolar transistor. Also, the base-emitter breakdown voltage with opened collector $BV_{BEO}$ is high. Furthermore, the various operating characteristics for the preferred embodiments of the bipolar transistor when the transistor is biased for either forward or reverse operation are symmetrical. For example, the collector-base and emitter-base characteristics of the transistor are symmetrical for forward and reverse biasing thereof. Additionally, the preferred embodiments of the bipolar transistor exhibit desirable saturation characteristics so that a large input signal can be adequately amplified with fidelity.

Figure 4:
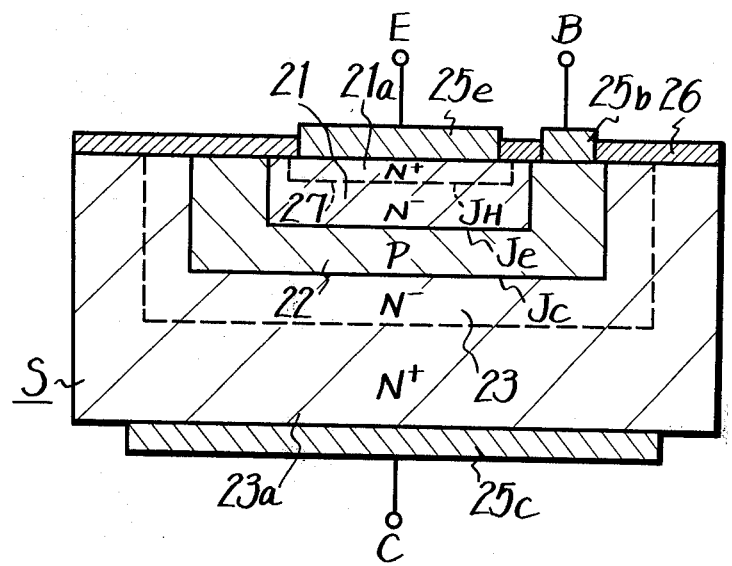
FIG. 4 is a sectional view showing one example of a bipolar transistor which may be used in the transistor amplifier of this invention.

The aforenoted features are found in the improved bipolar transistor which is schematically depicted in FIG. 4. In the illustrated embodiments, an NPN transistor is shown; however, it should be readily understood that the following description is equally applicable to a PNP bipolar transistor. Successive adjacent layers of semiconductor material of opposite type conductivity are provided in a substrate S so as to form, in order, an emitter region 21 of a first conductivity type, such as N-type, with high resistivity, a base region 22 of second conductivity type, or P-type, with high resistivity, and a collector region 23 of the first conductivity type, or N-type, with high resistivity. The first, second and third regions, i.e., the emitter, base and collector regions, are disposed adjacent to each other. As shown, the emitter region may be surrounded by the base region which, in turn, is surrounded by the collector region. Alternatively, the respective regions may be suitably stacked so that one adjacent region does not surround another. In the alternative embodiment, the stacked regions would extend to an exposed surface of the structure so that suitable electrodes can be connected thereto.

A first PN junction, or emitter junction, Je is formed between the first and second, or emitter and base, semiconductor regions 21 and 22. A second PN junction, or collector junction, Jc is formed between the second and third, or base and collector, semiconductor regions 22 and 23. The semiconductor region 21 has a potential barrier 27 formed therein which is positioned opposite the junction Je and is spaced therefrom by a distance which is smaller than the diffusion distance Lp of minority carriers (such as holes) which are injected into the region 21 from the region 22. The energy level of the potential barrier 27 is greater than the energy of the injected minority carriers and is at least as great as heat energy which may be represented as $kT$, wherein $k$ is the Boltzmann constant and T temperature. The potential barrier is formed by providing a region 21a of high impurity concentration but of the same conductivity type in the region 21. The addition of the high impurity concentration region 21a forms an L-H junction $J_H$ in the region 21. It should be appreciated that the potential barrier 27 forms a transition region across, for example, the junction $J_H$ which may be considered as having a given width.

As shown in FIG. 4, respective electrodes, i.e., emitter, base and collector electrodes 25a, 25b and 25c are deposited on the high impurity concentration region 21a which is within the emitter region 21, on the base region 22 and on the collector region 23, respectively. These electrodes are in ohmic contact with the corresponding regions and respective terminals are derived therefrom so as to form emitter, base and collector terminals A, B and C, respectively.

That portion of the region 21 which is not provided with the high impurity concentration has a relatively low impurity concentration, on the order of $10^{15}$ atoms/cm$^3$. The impurity concentration of the region 22 is somewhat higher, on the order of about $10^{15}$ to $10^{17}$ atoms/cm$^3$. The region 23 has an impurity concentration which is relatively low and is similar to the low impurity concentration described for the region 21, on the order of $10^{15}$ atoms/cm$^3$. Since the impurity concentration in the regions 21, 22 and 23 at the portions in the vicinity of the junctions Je and Jc are low, and since the crystalline property of the respective regions is excellent, the diffusion distance $L_p$ of the minority carriers injected into the region 21 becomes high.

A portion of the substrate S is provided with a low resistance region 23a having a high impurity concentration. This region 23a is opposite to and spaced away from the junction Jc. Also, an insulating layer 26, such as silicon dioxide (SiO$_2$) is formed on the upper surface of the substrate S and across the surface of the illustrated structure.

If the bipolar transistor illustrated in FIG. 4 is provided with suitable voltages at the respective emitter, base and collector terminals so that the emitter junction Je is forward biased and the collector junction Jc is reverse biased, transistor operation is attained and the holes injected from the region 22, i.e., the base region, into the region 21, i.e., the emitter region, have a long lifetime and, moreover, are provided with a long diffusion distance $L_p$. As a result thereof, the emitter injection efficiency $\gamma$ can be high. However, regardless of the actual diffusion length $L_p$, if the injected holes reach the substrate surface to result in surface recombination thereat, the effective diffusion length $L_p$ is significantly shortened. But, in accordance with the structure shown in FIG. 4, the potential barrier 27, which is spaced from the junction Je by a distance which is shorter than the diffusion length, decreases surface recombination so that the effective diffusion length $L_p$ can be considered to be relatively long. Accordingly, the current component Jp of injected holes from the region 22 into the region 21 is decreased. That is, the difference of the quasi-Fermi levels between these regions, or the inherent built-in voltage at the L-H junction $J_H$, serves to oppose the minority carrier diffusion. Consequently, when the potential barrier 27 is of a sufficiently high energy level, the diffusion current due to the concentration gradient of holes at the L-H junction $J_H$ and the drift current due to the builtin voltage cancel each other to thereby reduce the minority carrier current $J_p$ injected from the base region through the low impurity concentration emitter region. Therefore, the current component formed of electrons passing through the emitter junction Je to the collector region is increased to thereby increase the emitter injection efficiency $\gamma$ so as to enhance the amplification factor $h_{FE}$.

The height of the potential barrier, that is, the difference in the energy level thereacross, must be higher than the energy of the injected holes and at least as great as the aforenoted heat energy. Desirably, the height of the potential barrier should be higher than 0.1 eV. Another factor which determines the height of the potential barrier is that the hole diffusion length must not terminate within the transition region established by the potential barrier. That is, the diffusion length $L_p$ must be longer than the width of this transition region. Accordingly, a potential barrier of 0.2 eV is satisfactory and can be formed by the judicious selection of the amount of impurities in the high impurity concentration region 21a and its gradient.

Figure 5:
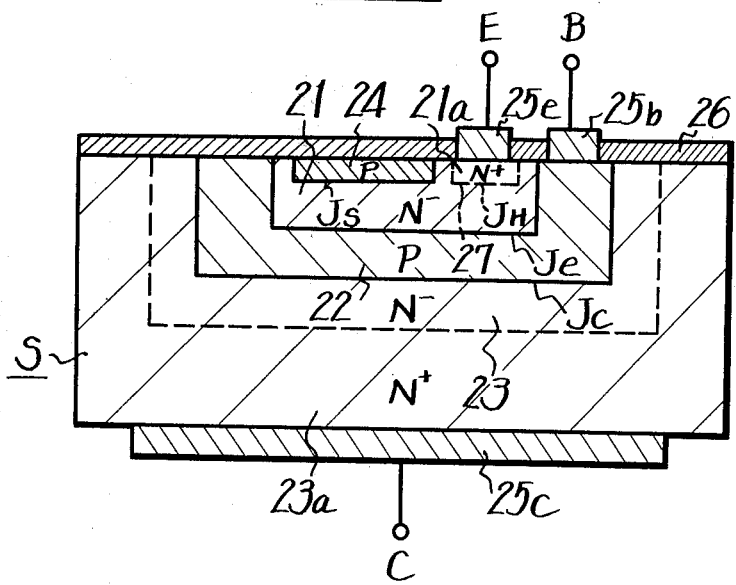
FIG. 5 is a sectional view showing another example of a bipolar transistor which may be used in the transistor amplifier of this invention.

Another embodiment of a bipolar transistor which may be used with this invention is depicted in FIG. 5 wherein like component parts are identified by like reference numerals. It is seen that the FIG. 5 embodiment differs from the FIG. 4 embodiment in that the region 21, in addition to having the high impurity concentration region 21a therein also is provided with a P-type region 24 which, like the region 21a, forms a junction $J_S$ which is opposite to and spaced from the emitter junction Je. The junction $J_S$ is a PN junction and is not contiguous with the L-H junction $J_H$. The distance between the PN junction $J_S$ and the emitter junction Je is less than the diffusion length $L_p$ of minority carriers which are injected into the region 21. This, it is recalled, is similar to the separation between the potential barrier 27 and the emitter junction Je. Hence, holes which are injected into the region 21 will reach the P-type region 24 because of the longer diffusion length $L_p$ and will be absorbed into the P-type region. The region 24 may be considered to be electrically isolated so that its potential is increased as a function of the absorption of holes, resulting in the forward biasing of the PN junction $J_S$. Consequently, holes are reinjected into the region 21 from the region 24. The concentration of holes in the region 21 adjacent the P-type region 24 thus is increased. Accordingly, the concentration distribution of holes in the region 21 between the junctions Je and $J_S$ is uniform to establish a gentle gradient which decreases the flow of diffusion current $J_p$ from the region 22 into the region 21.

Since the regions 21 and 23 have approximately the same low impurity concentration, it is appreciated that the preferred embodiments of the bipolar transistor are of symmetrical construction with respect to the region 22. Because of this, the illustrated bipolar transistor can be operated as either a forward transistor wherein the regions 21, 22 and 23 are operated as emitter, base and collector regions, respectively, or as a backward transistor wherein the region 21, 22 and 23 are operated as collector, base and emitter regions, respectively. Thus, both the construction and electrical characteristics of the bipolar transistor are symmetrical.

The aforedescribed preferred embodiments of the bipolar transistor which can be advantageously used in the present invention are accompanied by several advantages, such as the current amplification factor $h_{FE}$ can be made very high and, for example, can exceed 3,000. In the event of scattering within the transistor structure, the value of the amplification factor $h_{FE}$ is reduced. Also, $h_{FE}$ is maintained at a high value even for small currents because the influence of surface recombination is minimized. Transistor noise is significantly decreased. Furthermore, the operating characteristics for both forward and backward transistors are symmetrical. Also, the opened-collector base-emitter breakdown voltage $BV_{BEO}$ is high for both the forward and backward transistor because the impurity concentrations in the vicinities of the junctions Je and Jc are low. When used as a power transistor, emission from the emitter is made uniform because of the distributed resistance therein so that the breakdown strength is high. Additionally, the saturation characteristics of the aforedescribed preferred embodiments of the bipolar transistor are excellent.

Certain Preferred Embodiments of Transistor Amplifiers

Turning now to FIG. 6, there is illustrated one embodiment of a transistor amplifier in accordance with the present invention wherein a bipolar transistor $Q_1$ and an FET $Q_2$ having triode-type dynamic characteristics are connected for parallel operation. The bipolar transistor $Q_1$ is of the type previously described with respect to FIGS. 4 and 5 and is depicted with two arrowheads at its emitter to distinguish the bipolar transistor in this embodiment from conventional, prior art transistors. The FET $Q_2$ is of the type previously described with respect to FIGS. 1 and 2.

In the illustrated embodiment, the bipolar and field effect transistors are connected for parallel operation by the respective conductors $l_1$, $l_2$ and $l_3$. More specifically, the collector electrode of the transistor $Q_1$ is connected directly to the drain electrode of the FET $Q_2$ by the conductor $l_1$ which, in turn, is connected to a source of operating potential +B. The emitter electrode of the transistor $Q_1$ is connected by the conductor $l_2$ to the drain electrode of the FET $Q_2$, these common-connected electrodes being further connected to an output terminal $t_2$. The base electrode of the transistor $Q_1$ is connected to the gate electrode of the FET $Q_2$ by the conductor $l_3$ which, in turn, is further connected to an input terminal $t_1$. As shown, a load impedance $Z_L$ is connected between the output terminal $t_2$ and a reference potential, such as ground. Although not shown, a bias circuit is connected to the input of the illustrated amplifier, such as to the input terminal $t_1$, to provide a suitable bias potential such that the amplifier circuit can be operated as a class-B amplifier, for example.

The bipolar and field effect transistors can be connected directly to each other in parallel because the bipolar transistor has the symmetrical characteristics described above and because the opened-collected emitter-base breakdown voltage is as high as the opened-emitter collecter-base breakdown voltage. The high opened-collector emitter-base breakdown voltage permits the class-B operation so that the transistors are conductive only during a half-cycle of the input signal.

The operation of the amplifier circuit shown in FIG. 6 will best be understood in conjunction with the characteristic curves shown in FIG. 7. These curves represent the relationship between the current and voltage across the collector-emitter circuit of the transistor $Q_1$ and across the drain-source circuit of the FET $Q_2$. In particular, the respective curves $St_0$, $St_1$, $St_2$, . . . identify respective current-voltage relationships for the collector-emitter circuit of the transistor $Q_1$ when the base current $I_B$ is $I_{B0}$, $I_{B1}$, $I_{B2}$, . . . , respectively. The respective curves $S_{f0}$, $J_{f1}$, $S_{f2}$, . . . , identify the relationship between the current and voltage across the drain-source circuit of the FET $Q_2$ when the gate-source voltage $V_{GS}$ is 0, $V_{GS1}$, $V_{GS2}$, . . . , respectively. A load line $h_0$ is drawn as a composite load line for the combined transistors $Q_1$ and $Q_2$ with an operating voltage of, for example, $V_{cc}$. In particular, the load line $h_0$ is formed of the load line $h_1$ which is associated with the FET $Q_2$ and a load line $h_2$ which is an equivalent load line for the combined operation of the bipolar and field effect transistors, as will soon be described. Another load line $h_3$ is drawn and is associated with the operation of the bipolar transistor $Q_1$. Furthermore, the illustrated characteristic curves can be divided into a region A which corresponds to the active region of the FET $Q_2$ and a region B which corresponds to the saturated region of the FET.

The amplifier operation will be described for the condition wherein an input voltage $S_V$, as shown in FIG. 7 is applied to the input terminal $t_1$, resulting in an output current $S_i$ which flows from the output terminal $t_2$ through the load impedance $Z_L$. This load current $S_i$ includes a component M which flows through the bipolar transistor $Q_1$ and a component N which flows through the FET $Q_2$, as represented in FIG. 7.

It is recalled that, in this example, the amplifier circuit is biased for class-B operation. Accordingly, as the magnitude of the input voltage $S_V$ applied during, for example, the negative half-cycle, is increased, the drain current $I_D$ flowing through the FET $Q_2$ is correspondingly increased along the load line $h_1$ from the point $P_1$ toward the point $P_2$. During this initial increase in the magnitude of the input voltage, the base electrode of the bipolar transistor $Q_1$ is reversed biased and its collector current $I_C$ is substantially equal to zero. Now, when the input voltage is increased to the magnitude $V_1$, the load line $h_1$ is seen to intersect the characteristic curve $S_{f_0}$ at the point $P_2$ whereat the load current now is equal to $I_1$. At this point, the base electrode of the bipolar transistor $Q_1$ now is forward biased so that the transistor is rendered conductive and collector current flows therethrough. As the magnitude of the input voltage is further increased, the total load current, which is equal to the summation of the collector current $I_C$ and the drain current $I_D$, is further increased to the point $P_3$ along the composite load line portion $h_2$. However, it is appreciated that, while the input voltage magnitude is increased from the level $V_1$, the FET operates along the curve $S_{f_0}$ so that the drain current $I_D$ decreases from the point $P_2$ to the point $P_5$, the latter point being disposed at the origin 0. At the same time, the collector current $I_C$ increases along the load line $h_3$ from the point $P_4$ to the point $P_3$. It is appreciated that this load line $h_3$ intersects the abscissa at the point $V_1$ because this is the voltage at which the bipolar transistor $Q_1$ first becomes conductive. Since the decrease in the drain current is accompanied by a similar increase in the collector current, it is seen that the cumulative load current which is equal to the sum of the collector and drain currents can be represented by the composite load line $h_2$.

Although the foregoing has described the operation of the amplifier whose embodiment is depicted in FIG. 6 wherein the amplifier is biased for class-B operation, it is appreciated that the amplifier can be operated in any other mode, as desired. Also, since the class-B operation has been assumed for the purpose of explanation, it is recognized that the input voltage $S_V$ may be thought of as decreasing from a maximum point along the illustrated axis to a minimum peak point during the negative half-cycle thereof. That is, the above description of an increase in the magnitude of the input voltage can be thought of, alternatively, as a decrease in the input voltage amplitude.

Whereas the bipolar transistor $Q_1$ shown in the embodiment of FIG. 6 is formed of the improved bipolar transistor previously described and shown with respect to FIGS. 4 and 5, the present invention can be constructed of a bipolar transistor of the conventional type previously used by the prior art. FIG. 8 illustrates one embodiment of an amplifier in accordance with the present invention wherein such prior art bipolar transistor $Q_1$ is used. It is appreciated that like reference numerals are used in the FIG. 8 embodiment to identify corresponding component parts previously described with respect to FIG. 6.

The opened-collector emitter-base breakdown voltage of the conventional bipolar transistor is relatively low in comparison to its opened-emitter collector-base voltage. Accordingly, the FET $Q_2$ and the bipolar transistor $Q_1$ are connected by coupling the emitter electrode of the transistor $Q_1$ to the source electrode of the FET $Q_2$ by a semiconductor PN junction, such as a forwardly poled diode D. In addition, although an input signal is applied directly to the base electrode of the transistor $Q_1$ from the input terminal $t_1$, such input signal is applied to the gate electrode of the FET $Q_2$ through the base-emitter path of the transistor.

Since the operation of the embodiment shown in FIG. 8 is substantially identical to the aforedescribed operation of the embodiment of FIG. 6, further description thereof need not be provided in the interest of brevity.

Figure 9:
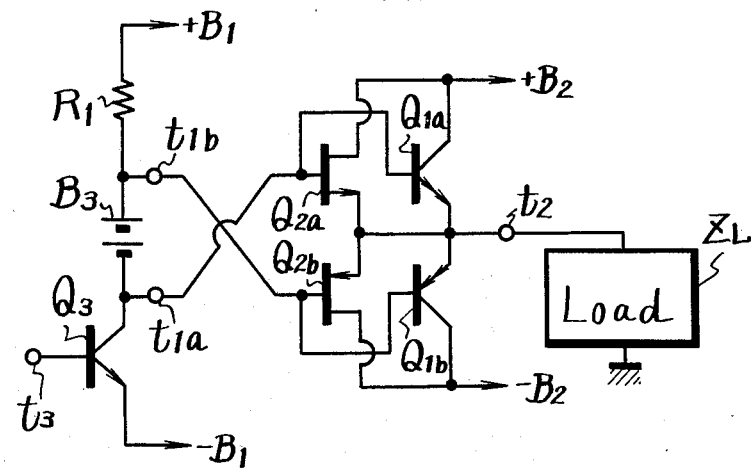
FIGS. 9, 10 and 11 are schematic diagrams showing additional embodiments of the transistor amplifier in accordance with this invention.

The amplifier shown and described with respect to the embodiments of FIGS. 6 and 8 finds ready application in, for example, a push-pull amplifier whereby high level output signals are supplied to a load impedance. One embodiment of such a push-pull amplifier is schematically illustrated in FIG. 9. As shown, one stage of the push-pull amplifier is comprised of the bipolar transistor $Q_{1a}$ and the FET $Q_{2a}$. A complementary stage of the push-pull amplifier is formed of the bipolar transistor $Q_{1b}$ and the FET $Q_{2b}$. It is appreciated that the respective bipolar transistors may be of the type previously described with respect to FIGS. 4 and 5. The bipolar transistor $Q_{1a}$ may be an NPN transistor and the FET $Q_{2a}$ may be an N-channel FET, the connections between the bipolar and field effect transistors being substantially the same as the connections previously shown in FIG. 6. The complementary push-pull stage is formed of a PNP bipolar transistor and a P-channel FET which are interconnected in a manner analogous to the FIG. 6 embodiment. A supply of positive operating potential $+B_2$ is connected to the common-connected collector and sources electrodes of the bipolar transistor $Q_{1a}$ and FET $Q_{2a}$. A supply of negative operating potential $-B_2$ is coupled to the common-connected collector and source electrodes of the bipolar transistor $Q_{1b}$ and FET $Q_{2b}$. The emitter and drain electrodes in each stage of the push-pull amplifier are connected in common to the output terminal $t_2$ which, in turn, is coupled to the load impedance $Z_L$.

Each stage of the push-pull amplifier is adapted to be supplied with suitable bias potentials and to receive an input signal. To this effect, a source of bias voltage $B_3$ is provided, having a positive terminal connected through a first input $t_{1b}$ to the base and gate electrodes of the transistor $Q_{1b}$ and the FET $Q_{2b}$. The negative terminal of the bias voltage source $B_3$ is supplied through a second input $t_{1a}$ to the base and gate electrodes of the transistor $Q_{1a}$ and the FET $Q_{2a}$. In addition, an input driving transistor $Q_3$ is provided with its collector-emitter circuit connected in series between the negative terminal of the bias voltage supply $B_3$ and a negative operating voltage supply $-B_1$. The base electrode of the driving transistor $Q_3$ is connected to a signal input terminal $t_3$. To complete the input circuit, the collector of the transistor $Q_3$ is additionally connected through the bias voltage supply $B_3$ to a load resistor $R_1$ and thence to a supply of positive operating potential $+B_1$. As may be apreciated, the driving transistor $Q_3$ supplies the input signal supplied to the input terminal $t_3$ through the bias voltage supply to the respective input terminals $t_{1a}$ and $t_{1b}$.

In the embodiment shown by way of example in FIG. 9, the push-pull amplifier is biased for class-B operation so that the positive and negative half-cycles of an input signal are supplied by the driving transistor $Q_3$ to the input terminals $t_{1a}$ and $t_{1b}$, respectively. Thus, the illustrated embodiment forms a single ended push-pull amplifier. In this amplifier, the operating potential $B_1$ is larger than the operating potential $B_2$. Also, the opened-collector emitter-base breakdown voltages of the respective bipolar transistors $Q_{1a}$ and $Q_{1b}$ may be more than twice the pinch-off voltage $V_p$ of the FET's $Q_{2a}$ and $Q_{2b}$.

Since the bipolar transistor is operated over a range of low collector-emitter voltage, as shown by the characteristic curves of FIG. 7, it is recognized that the collector loss of the transistor is minimized so that a small heat sink can be used therewith. Also, although the configuration shown in FIG. 8 may be used as the respective push-pull amplifier stages, it is preferred to use the bipolar transistor previously described with respect to FIGS. 4 and 5 so that a diode need not be used and the construction of the amplifier circuit can be simplified. Thus, the push-pull amplifier of the illustrated embodiment exhibits the necessary switching characteristics for use in push-pull configuration, has the suitable saturation characteristics to permit large signal amplification, is accompanied by low noise, has a high opened-collector base-emitter breakdown voltage and has a highly efficient voltage source utilization rate.

Figure 10:
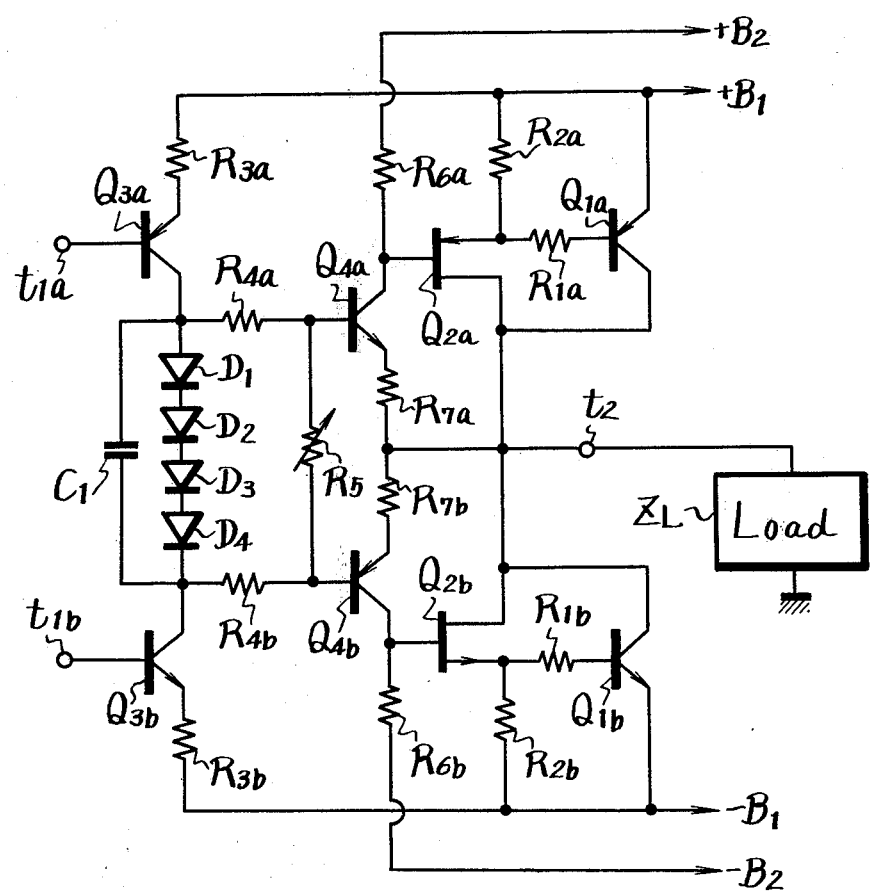

Another embodiment of this invention now will be described in the environment of a single ended push-pull amplifier. As illustrated in FIG. 10, one stage of the push-pull amplifier is formed of a PNP bipolar transistor $Q_{1a}$ and a P-channel FET $Q_{2a}$, the FET having triode-type dynamic characteristics. The other stage of the push-pull amplifier is complementary to the first stage and is formed of the NPN transistor $Q_{1b}$ and N-channel FET $Q_{2b}$, this FET also having triode-type dynamic characteristics.

The transistor $Q_{1a}$ is connected to the FET $Q_{2a}$ therewith. In particular, the transistor $Q_{1a}$ is maintained nonconductive until the current flowing through the FET $Q_{2a}$ exceeds a predetermined threshold level. To this effect, a detector circuit is provided to sense the current level through the FET so as to activate the transistor to its conductive state when the sensed current level exceeds the predetermined threshold level. In one embodiment of a suitable detector circuit, a resistor $R_{2a}$ is connected to the source electrode of the FET. The junction defined by the resistor $R_{2a}$ and the source electrode is connected by a resistor $R_{1a}$ to the base electrode of the transistor $Q_{1a}$. As shown, the other end of the resistor $R_{2a}$ is connected to the emitter electrode of the transistor $Q_{1a}$ and, further, to the operating potential supply $+B_1$.

A similar detector circuit is provided to sense the current level through the FET $Q_{2b}$ and to activate the transistor $Q_{1b}$ to its conducting state when the FET current exceeds a predetermined threshold level.

The collector and drain electrodes of the transistor $Q_{1a}$ and the FET $Q_{2a}$, as well as the transistor $Q_{1b}$ and the FET $Q_{2b}$, are connected directly to each other and to an output terminal $t_2$. Thus, current from the respective push-pull stages flows from the output terminal through the load impedance $Z_L$. It is appreciated that the respective detector circuits described above serve not only to detect the FET current but, also, to detect the current flowing through the FET and thence through the output terminal $t_2$ to the load.

Suitable bias potentials and input signals to be amplified are supplied to the respective gate electrodes of the FET's $Q_{2a}$ and $Q_{2b}$ by a two-stage class-A amplifier. In one operative embodiment thereof, the push-pull amplifier stages are biased for class-B operation. The first stage of the class-A amplifier includes the complementary bipolar transistors $Q_{3a}$ and $Q_{3b}$. The base electrodes of these respective transistors are connected to input terminals $t_{1a}$ and $t_{1b}$, respectively, to receive input signals to be amplified. The emitter electrode of the transistor $Q_{3a}$ is connected through an emitter resistor $R_{3a}$ to the operating potential supply $+B_1$ and the collector electrode of this transistor supplies the received input signal through a resistor $R_{4a}$ and through a transistor $Q_{4a}$ (to be described) to the gate electrode of the FET $Q_{2a}$. The input transistor $Q_{3b}$ is symmetrically connected to supply the input signal received at the input terminal $t_{1b}$ through the resistor $R_{4b}$ and through the transistor $Q_{4b}$ (to be described) to the gate electrode of the FET $Q_{2b}$. The first-stage transistors $Q_{3a}$ and $Q_{3b}$ are complementary so that if the transistor $Q_{3a}$ is a PNP transistor, then the transistor $Q_{3b}$ is an NPN transistor.

The second stage of the class-A amplifier is formed of complementary transistors $Q_{4a}$ and $Q_{4b}$ which are adapted to supply respective bias potentials to the FET's $Q_{2a}$ and $Q_{2b}$. If the transistor $Q_{4a}$ is an NPN transistor then the transistor $Q_{4b}$ is a PNP transistor. A constant voltage supply formed of a plurality of series-connected diodes $D_1$, $D_2$, $D_3$ and $D_4$, for example, is connected, via the resistors $R_{4a}$ and $R_{4b}$, across the respective base electrodes of the transistors $Q_{4a}$ and $Q_{4b}$. A capacitor $C_1$ is connected in parallel with the series-connected diodes. As shown, the diodes also are connected across the respective collector electrodes of the first stage of complementary transistors $Q_{3a}$ and $Q_{3b}$. A variable resistor $R_5$, which may comprise a potentiometer, a rheostat, or the like, is connected directly across the respective base electrodes of the second stage of complementary transistors and is adapted, when operated, to adjust the bias voltages supplied through these complementary transistors to the gate electrodes of the FET's.

The collector circuits of the complementary transistors $Q_{4a}$ and $Q_{4b}$ are connected to operating potential supplies of opposite polarity $+B_2$ and $-B_2$ by the resistors $R_{6a}$ and $R_{6b}$, respectively. The respective emitter electrodes of these complementary transistors are connected to the output terminal $t_2$ by the emitter resistors $R_{7a}$ and $R_{7b}$, respectively. In the example shown in FIG. 10, the operating potential $B_2$ is of greater magnitude than the operating potential $B_1$.

In operation, the input signals applied to the input terminals $t_{1a}$ and $t_{1b}$ are supplied by the driving transistors $Q_{3a}$ and $Q_{3b}$ through the bias transistors $Q_{4a}$ and $Q_{4b}$ to the push-pull amplifier stages in alternate half-cycles. The input signals thus supplied to the gate electrodes of the FET's are superposed onto the bias voltages produced by the bias transistors $Q_{4a}$ and $Q_{4b}$. Since the voltage across the respective base electrodes of these transistors is a constant voltage due to the constant voltage supply formed by the series-connected diodes, the collector currents of the transistors $Q_{4a}$ and $Q_{4b}$ are maintained constant such that the FET gate electrodes are supplied with predetermined bias potentials.

When the input signals are of low magnitudes, only the FET's $Q_{2a}$ and $Q_{2b}$ are conductive, the transistors $Q_{1a}$ and $Q_{1b}$ being nonconductive. As the input signal level increases, the currents flowing through the FET's correspondingly increase and the load current also increases. As the FET currents increase, the currents flowing through the detector resistors $R_{2a}$ and $R_{2b}$ correspondingly increase, resulting in changing voltages which are applied to the base electrodes of the transistors $Q_{1a}$ and $Q_{1b}$. Thus, when the FET currents (or the load current) exceed a threshold level determined by the resistance values of the resistors $R_{1a}$, $R_{2a}$ and $R_{1b}$, $R_{2b}$, the transistors $Q_{1a}$ and $Q_{1b}$ are rendered conductive. At that time, both the transistors and the FET's included in the respective push-pull stages operate together and the summation of the currents flowing therethrough is supplied to the load impedance.

Figure 11:
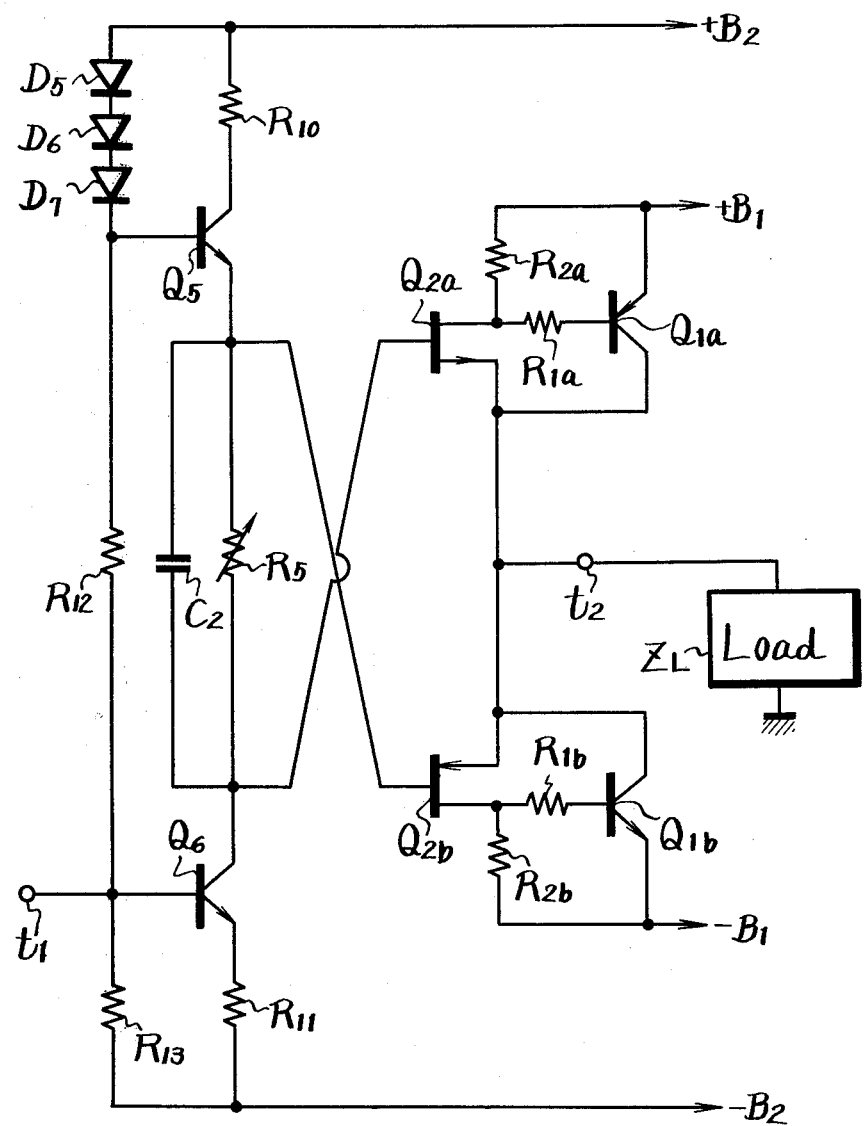

In the embodiment shown in FIG. 10, the FET's supply the load impedance with amplified current in the drain-follower configuration. An alternative embodiment now will be described with reference to FIG. 11 wherein a source-follower configuration is shown. Like reference numerals are used in the FIG. 11 embodiment to identify the same components parts which have just been described. Each push-pull stage is formed of a bipolar transistor connected to an FET having triode-type dynamic characteristics. A detector circuit is provided in each push-pull stage for sensing when the FET (or load) current exceeds a threshold value and to then activate the bipolar transistor to its conductive state. The FET's $Q_{2a}$ and $Q_{2b}$ shown in FIG. 11 differ from the corresponding FET's shown in FIG. 10 in that the FET's of the FIG. 11 embodiment are disposed in source-follower configuration. Accordingly, an N-channel FET is connected to a PNP transistor and a P-channel FET is connected to an NPN transistor. In particular, the source electrode of the FET $Q_{2a}$ is connected to the collector electrode of the transistor $Q_{1a}$ and is further connected to the output terminal $t_2$ to which the load impedance $Z_L$ is connected. Similarly, the source electrode of the FET $Q_{2b}$ is connected directly to the collector electrode of the transistor $Q_{1b}$ and, additionally, to the output terminal $t_2$.

The push-pull amplifier is driven by a class-A input stage which supplies both input signals and suitable bias potentials to the push-pull stages. In one example of the illustrated embodiment, the push-pull amplifier is supplied with bias potentials so as to be operated as a class-B amplifier. The input driving stage includes a drive transistor $Q_6$ having a base electrode connected to the input terminal $t_1$ to receive an input signal which is adapted to be amplified. An emitter resistor $R_{11}$ is connected between the emitter electrode of this transistor and a negative operating potential supply $-B_2$. A base resistor $R_{13}$ connects the base electrode of the transistor $Q_6$ to this operating potential supply. The collector electrode of the transistor $Q_6$ is connected through a bias circuit to supply the input signal to the respective gate electrodes of the FET's $Q_{2a}$ and $Q_{2b}$.

The bias network is comprised of a constant current source which includes a transistor $Q_5$ whose base electrode is supplied with a constant voltage. The constant voltage is determined by series-connected diodes, for example, diodes $D_5$, $D_6$ and $D_7$ which extend between the positive operating potential supply $+B_2$ and the base electrode of the transistor $Q_5$. A resistor $R_{12}$ extends between the respective base electrodes of the transistors $Q_5$ and $Q_6$ to thus form the series circuit formed of the diodes, the resistor $R_{12}$ and the resistor $R_{13}$ across the positive and negative operating potential supply $B_2$, as shown.

To complete the constant current source, the collector electrode of the transistor $Q_5$ is connected by a collector resistor $R_{10}$ to the positive operating potential supply $+B_2$ and the emitter electrode of this transistor is connected through the variable resistor $R_5$ to the collector electrode of the drive transistor $Q_6$. A capacitor $C_2$ is connected in parallel with the variable resistor $R_5$. As shown, the collector electrode of the transistor $Q_6$ is connected directly to the gate electrode of the FET $Q_{2a}$ and is connected through the variable resistor $R_5$ to the gate electrode of the FET $Q_{2b}$.

The constant voltage applied to the base electrode of the transistor $Q_5$ results in a constant current through the collector-emitter circuit thereof. Thus, by adjusting the resistance value of the resistor $R_5$, the voltages thereacross can be correspondingly adjusted so as to supply adjustable bias potentials to the FET's. Hence, when in input signal is applied to the input terminal $t_1$, the drive transistor $Q_6$ superposes this input signal on the bias potential provided at the gate electrodes of the respective FET's. It may be appreciated that the amplifier circuit shown in the embodiment of FIG. 11 operates in substantially the same manner as the amplifier circuit previously described with respect to the embodiment shown in FIG. 10.

It should be readily appreciated that the amplifier circuit disclosed in accordance with the teachings of the present invention and particularly shown with reference to certain preferred embodiments can be supplied with suitable bias potentials so as to operate as a class-A, -AB, -B or -C amplifier. The specific class of amplifier is not critical to the present invention. Furthermore, whereas the detector circuits shown in FIGS. 10 and 11 serve to actuate the bipolar transistors upon detecting the FET current, it should be recognized that the bipolar transistor can be rendered conductive when the drain current, source current or gate voltage of the FET exceeds a pre-established, threshold value. Thus, the conductivity of the bipolar transistor can be controlled by detecting any of the foregoing parameters of the FET as well as by detecting when the saturation region thereof has been reached. It should also be recognized that the ratio between the power losses of the FET and the bipolar transistor can be judiciously selected so that the same output can be obtained with lower FET losses.

While the present invention has been particularly shown and described with reference to preferred embodiments thereof and particular examples have been explained with respect to push-pull amplifiers, it will be obvious to those skilled in the art that this invention may be utilized in other amplifier configurations wherein good saturation characteristics, minimal crossover distortion, high breakdown voltage characteristics, low collector losses and good switching characteristics are desired. Consequently, it is apparent that the foregoing and various other changes and modifications in form and detail may be made without departing from the spirit and scope of the invention. It is therefore intended that the appended claims be interpreted as including all such changes and modifications.

What is claimed is:
1. A transistor amplifier, comprising:
a field effect transistor having triode-type dynamic characteristics in combination with a bipolar transistor, said field effect transistor including drain, gate and source electrodes, and having a current flowing therein that is a function of an input signal, said bipolar transistor including collector, base and emitter electrodes and having at least one of said collector and emitter electrodes connected directly to at least one of said drain and source electrodes, said bipolar transistor being substantially nonconductive until said field effect transistor current reaches a threshold level and then having a current flowing therein that is a function of said input signal once said field effect transistor current reaches said threshold level;

means connected to said combination for supplying at least a portion of the summation of said field effect and bipolar transistor currents to a load; and means for supplying said input signal to said combination.

2. A transistor amplifier in accordance with claim 1 further comprising semiconductor means including a PN junction for connecting said emitter electrode to said source electrode.

3. A transistor amplifier in accordance with claim 2 wherein said gate electrode is connected directly to said emitter electrode.

4. A transistor amplifier in accordance with claim 3 wherein said load is connected directly to said source electrode.

5. A transistor amplifier in accordance with claim 1 wherein said bipolar transistor comprises a first semiconductor region of a first conductivity type, a second semiconductor region of a second conductivity type disposed adjacent said first semiconductor region, a third semiconductor region of said first conductivity type disposed adjacent said second semiconductor region; and a potential barrier positioned within said first semiconductor region spaced from and opposite the junction defined by said first and second semiconductor regions, said potential barrier having an energy level higher than that of minority carriers injected into said first semiconductor region and being spaced from said junction by a distance smaller than the diffusion distance of said minority carriers.

6. A transistor amplifier in accordance with claim 5 wherein said drain, gate and source electrodes are connected directly to said collector, base and emitter electrodes, respectively; said load is connected to said common-connected source and emitter electrodes; and said input signal is supplied to said common-connected gate and base electrodes.

7. A transistor amplifier in accordance with claim 1 further comprising detecting means coupled to said field effect transistor for detecting when said field effect transistor current reaches said threshold to then render said bipolar transistor conductive.

8. A transistor amplifier in accordance with claim 7 wherein said detecting means couples said base electrode to one of said drain and source electrodes.

9. A transistor amplifier in accordance with claim 8 wherein said detecting means comprises a first resistor for connecting said base electrode to one of said drain and source electrodes and a second resistor connected in series with said field effect transistor and through which said field effect transistor current flows; and wherein one of said collector and emitter electrodes is connected directly to the other of said drain and source electrodes and to said load.

10. A transistor amplifier in accordance with claim 9 wherein said second resistor is connected between said source electrode and means for supplying an operating potential, and said field effect and bipolar transistors are of like conductivity type.

11. A transistor amplifier in accordance with claim 9 wherein said second resistor is connected between said drain electrode and means for supplying an operating potential, and said field effect and bipolar transistors are of opposite conductivity type.

12. A transistor amplifier in accordance with claim 1 further comprising a second field effect transistor having triode-type dynamic characteristics in combination with a second bipolar transistor, said second field effect transistor including drain, gate and source electrodes and having a current flowing therein that is a function of said input signal, said second bipolar transistor including collector, base and emitter electrodes and having at least one of said collector and emitter electrodes thereof connected directly to at least one of said drain and source electrodes of said second field effect transistor means, said second bipolar transistor being substantially nonconductive until said second field effect transistor current reaches a threshold level and then having a current flowing therein that is a function of said input signal once said second field effect transistor current reaches said threshold level; said first and second combinations being connected to supply the summation of the first field effect and bipolar transistor currents and the summation of the second field effect and bipolar transistor currents to said load in push-pull configuration.

13. A transistor amplifier, comprising:

first and second amplifying circuits each including a field effect transistor having triode-type dynamic characteristics connected to a bipolar transistor, said bipolar transistor being substantially nonconductive until the saturation state of said field effect transistor is attained; each of said first and second amplifying circuits producing output currents porportional to the sum of the currents through said field effect and bipolar transistors;

means connected to said first and second amplifying circuits for supplying the current produced thereby to a load in push-pull relation; and means for supplying said input signal to said first and second amplifier circuits.

14. A transistor amplifier in accordance with claim 13 wherein the bipolar transistor included in each of said amplifying circuits has symmetrical operating characteristics with respect to the collector-base and emitter-base junctions thereof and wherein the opened-collector base-emitter breakdown voltage is relatively high and equal to the opened-emitter base-collector breakdown voltage.

15. A transistor amplifier in accordance with claim 14 wherein each said bipolar transistor comprises a first semiconductor region of a first conductivity type; a second semiconductor region of a second conductivity type disposed adjacent said first semiconductor region, a third semiconductor region of said first conductivity type disposed adjacent said second semiconductor region; and a potential barrier positioned within said first semiconductor region spaced from and opposite the junction defined by said first and second semiconductor regions, said potential barrier having an energy level higher than that of minority carriers injected into said first semiconductor region and being spaced from said junction by a distance smaller than the diffusion distance of said minority carriers.

16. A transistor amplifier in accordance with claim 15 wherein the drain, gate and source electrodes of the field effect transistor included in each amplifying circuit are connected directly to the collector, base and emitter electrodes, respectively, of the bipolar transistor included therein; and said load is connected to said common-connected source and emitter electrodes of each amplifying circuit.

17. A transistor amplifier in accordance with claim 16 wherein said means for supplying said input signal comprises bias means connected to said first and second amplifying circuits for supplying respective bias potentials thereto; and driving means connected to said bias means for receiving said input signal to apply said input signal to said first and second amplifying circuits through said bias means.

18. A transistor amplifier, comprising:
first and second amplifying circuits disposed in push-pull configuration for supplying current to a load, each amplifying circuit including a field effect transistor having triode-type dynamic characteristics, a bipolar transistor connected with said field effect transistor and a detector circuit connected to said field effect transistor for detecting when the current supplied to said load by said field effect transistor exceeds a predetermined value to render said bipolar transistor conductive; and
means for supplying an input signal to said first and second amplifying circuits.

19. A transistor amplifier in accordance with claim 18 wherein said means for supplying an input signal comprises bias means connected to said field effect transistors included in said first and second amplifying circuits for supplying respective bias potentials thereto; and driving means connected to said bias means for receiving said input signal and to apply same through said bias means to said respective field effect transistors.

20. A transistor amplifier in accordance with claim 19 wherein said bias means comprises a constant current source connected to resistance means to produce said respective bias potentials across said resistance means.

21. A transistor amplifier in accordance with claim 20 wherein said driving means comprises a driving transistor having its collector-emitter circuit connected in series with said constant current source and said resistance means, the output of said driving transistor being coupled to said respective field effect transistors.

22. A transistor amplifier in accordance with claim 19 wherein said bias means comprises first and second bias transistors having their respective collector electrodes coupled to operating voltage supply means, said respective collector electrodes being further connected to the respective field effect transistors included in said first and second amplifying transistors; and means for applying respective bias voltages to the base electrodes of said first and second bias transistors.

23. A transistor amplifier in accordance with claim 22 wherein said means for applying respective bias voltages comprises a constant voltage source coupled across the base electrodes of said first and second bias transistors; and variable resistance means connected across said base electrodes of said first and second bias transistors.

24. A transistor amplifier in accordance with claim 22 wherein said driving means comprises first and second driving transistors for receiving said input signal, the collector electrodes of said first and second driving transistors being coupled to the base electrodes of said first and second bias transistors, respectively.

* * * * *